United States Patent
Liu

(10) Patent No.: US 9,865,710 B2
(45) Date of Patent: Jan. 9, 2018

(54) FINFET HAVING A NON-UNIFORM FIN

(71) Applicant: STMICROELECTRONICS, INC., Coppell, TX (US)

(72) Inventor: Qing Liu, Watervliet, NY (US)

(73) Assignee: STMICROELECTRONICS, INC., Coppell, TX (US)

(*) Notice: Subject to any disclaimer, the term of this patent is extended or adjusted under 35 U.S.C. 154(b) by 0 days.

(21) Appl. No.: 14/843,221

(22) Filed: Sep. 2, 2015

(65) Prior Publication Data

US 2016/0293737 A1    Oct. 6, 2016

Related U.S. Application Data

(60) Provisional application No. 62/141,174, filed on Mar. 31, 2015.

(51) Int. Cl.
| | | |
|---|---|---|
| *H01L 21/306* | (2006.01) | |
| *H01L 21/78* | (2006.01) | |
| *H01L 29/66* | (2006.01) | |
| *H01L 29/78* | (2006.01) | |

(52) U.S. Cl.
CPC .... *H01L 29/66818* (2013.01); *H01L 29/6653* (2013.01); *H01L 29/66545* (2013.01); *H01L 29/66795* (2013.01); *H01L 29/785* (2013.01); *H01L 29/7834* (2013.01); *H01L 29/7843* (2013.01)

(58) Field of Classification Search
CPC ............. H01L 21/823842; H01L 21/84; H01L 21/0688; H01L 21/11; H01L 21/1104; H01L 29/66818; H01L 29/66545; H01L 29/7843; H01L 29/6653; H01L 29/7834; H01L 27/1203; H01L 29/7812
See application file for complete search history.

(56) References Cited

U.S. PATENT DOCUMENTS

| | | | | |
|---|---|---|---|---|
| 6,413,802 | B1 * | 7/2002 | Hu ........................ | H01L 21/845 257/E21.703 |
| 7,842,559 | B2 * | 11/2010 | Jakschik ................. | H01L 21/84 438/150 |
| 7,888,201 | B2 * | 2/2011 | Yeo ......................... | H01L 21/84 257/E21.661 |

(Continued)

OTHER PUBLICATIONS

Morin et al., U.S. Appl. No. 14/588,221, filed Dec. 31, 2014, "Defect-Free Strain Relaxed Buffer Layer".

(Continued)

*Primary Examiner* — Benjamin Sandvik
*Assistant Examiner* — Damon Hillman
(74) *Attorney, Agent, or Firm* — Seed IP Law Group LLP

(57) ABSTRACT

A dual width SOI FinFET is disclosed in which different portions of a strained fin have different widths. A method of fabrication of such a dual width FinFET entails laterally recessing the strained fin in the source and drain regions using a wet chemical etching process so as to maintain a high degree of strain in the fin while trimming the widths of fin portions in the source and drain regions to less than 5 nm. The resulting FinFET features a wide portion of the fin in the channel region underneath the gate, and a narrower portion of the fin in the source and drain regions. An advantage of the narrower fin is that it can be more easily doped during the growth of the epitaxial raised source and drain regions.

21 Claims, 6 Drawing Sheets

(56) References Cited

U.S. PATENT DOCUMENTS

| | | | |
|---|---|---|---|
| 8,278,173 B2* | 10/2012 | Lim | H01L 29/66545 |
| | | | 257/E21.632 |
| 9,048,219 B2* | 6/2015 | Kim | H01L 27/0924 |
| 2007/0001237 A1 | 1/2007 | King et al. | |
| 2010/0038679 A1 | 2/2010 | Chan et al. | |
| 2011/0175166 A1 | 7/2011 | Bedell et al. | |
| 2012/0115284 A1 | 5/2012 | Chien et al. | |
| 2013/0341638 A1 | 12/2013 | Liao et al. | |
| 2014/0054648 A1 | 2/2014 | Itokawa et al. | |
| 2014/0239401 A1 | 8/2014 | Basker et al. | |
| 2015/0279970 A1 | 10/2015 | Zhang | |
| 2015/0371892 A1* | 12/2015 | Xie | H01L 21/76224 |
| | | | 257/401 |

OTHER PUBLICATIONS

Liu et al., U.S. Appl. No. 14/588,116, filed Dec. 31, 2014, "Silicon Germanium-on-Insulator FinFET".

Extended European Search Report, dated Jul. 25, 2016, for European Application No. 15184606.4—1504, 3 pages.

\* cited by examiner

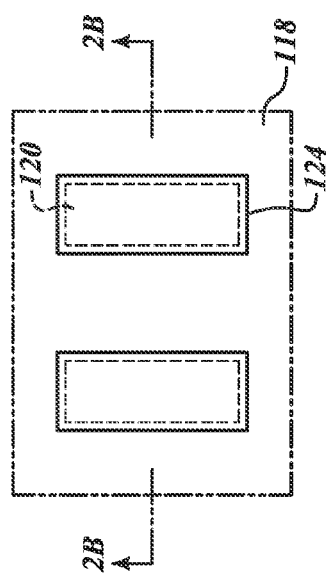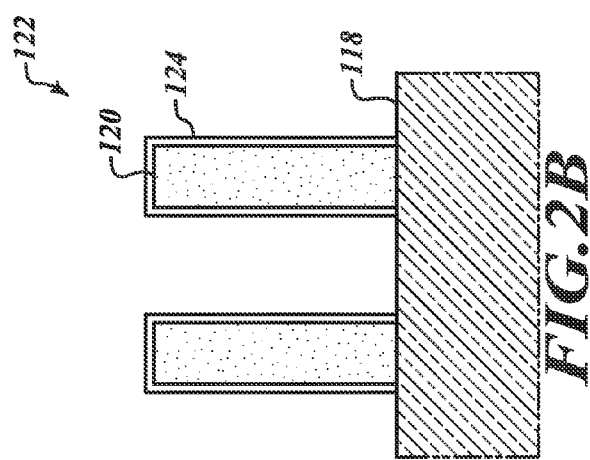

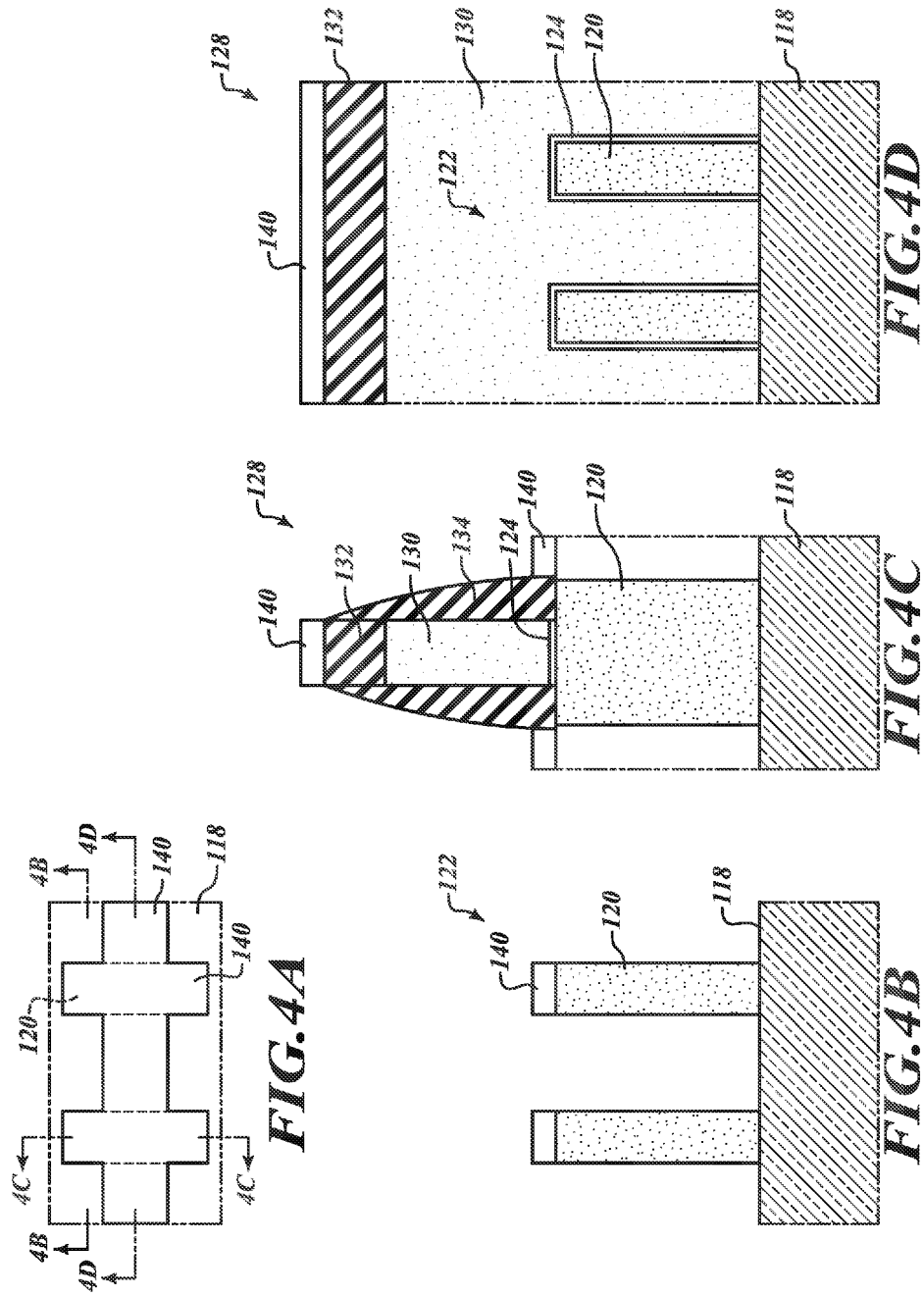

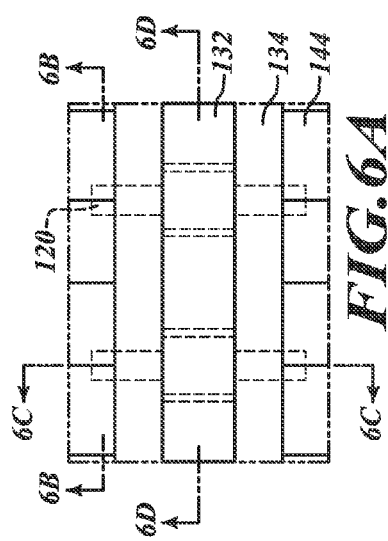
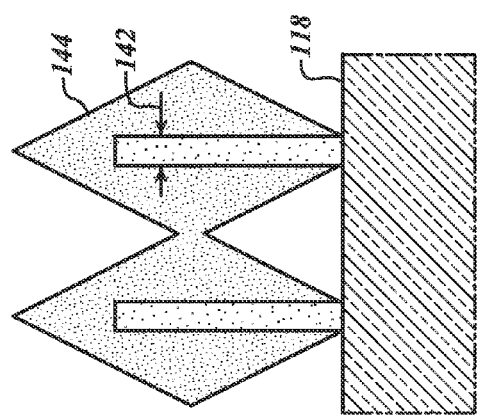
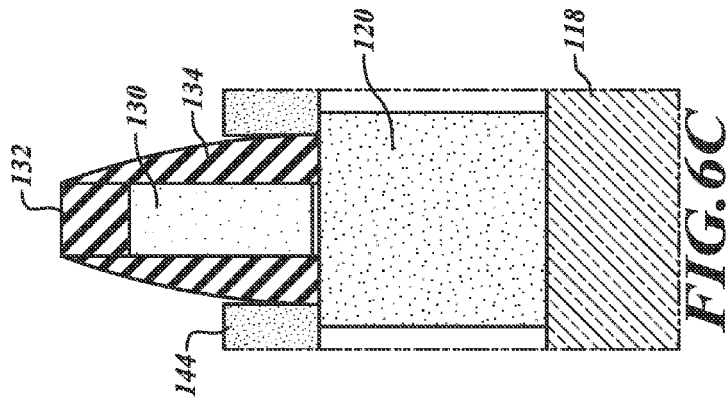
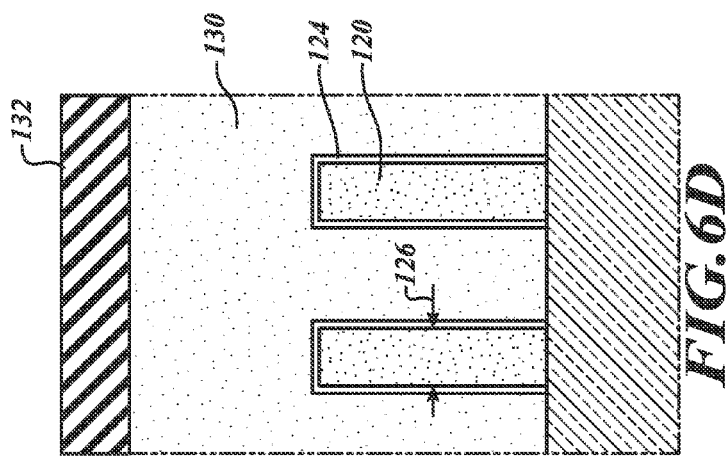

FINFET HAVING A NON-UNIFORM FIN

JOINT RESEARCH AGREEMENT

The subject matter claimed herein was made as a result of activities undertaken within the scope of a joint research agreement. The parties to the joint research agreement are (1) STMicroelectronics, Inc., (2) International Business Machines Corporation, and (3) GLOBALFOUNDRIES Inc.

BACKGROUND

Technical Field

The present disclosure generally relates to advanced transistor structures for use in integrated circuits.

Description of the Related Art

Advanced integrated circuits typically feature strained channel devices, silicon-on-insulator substrates, FinFET structures, or combinations thereof, in order to continue scaling transistor gate lengths below 20 nm. Such technologies allow the channel length of the transistor to shrink while minimizing detrimental consequences such as current leakage and other short channel effects.

A FinFET is an electronic switching device that features a conducting channel in the form of a semiconducting fin that extends outward from the substrate surface. In such a device, the gate, which controls current flow in the fin, wraps around three sides of the fin so as to influence current flow from three surfaces instead of one. The improved control achieved with a FinFET design results in faster switching performance in the "on" state and less current leakage in the "off" state than is possible in a conventional planar device.

Incorporating strain into the channel of a semiconductor device stretches the crystal lattice, thereby increasing charge carrier mobility in the channel so that the device becomes a more responsive switch. Introducing compressive strain into a PFET transistor tends to increase hole mobility in the channel, resulting in a faster switching response to changes in voltage applied to the transistor gate. Likewise, introducing a tensile strain into an NFET transistor tends to increase electron mobility in the channel, also resulting in a faster switching response.

There are many ways to introduce strain into the channel region of a FinFET. Techniques for introducing strain typically entail incorporating into the device epitaxial layers of one or more materials having crystal lattice dimensions or geometries that differ slightly from those of the silicon substrate. The epitaxial layers can be made of doped silicon or silicon germanium (SiGe), for example. Such epitaxial layers can be incorporated into source and drain regions, or into the transistor gate that is used to modulate current flow in the channel, or into the channel itself, which is the fin. Alternatively, strain can be induced in the fin from below the device by using various types of silicon-on-insulator (SOI) substrates. An SOI substrate features a buried insulator, typically a buried oxide layer (BOX) underneath the active area. SOI FinFET devices have been disclosed in patent applications assigned to the present assignee, for example, U.S. patent application Ser. No. 14/231,466, entitled "SOI FinFET Transistor with Strained Channel," U.S. patent application Ser. No. 14/588,116, entitled "Silicon Germanium-on-insulator FinFET," and U.S. patent application Ser. No. 14/588,221, entitled "Defect-Free Strain-Relaxed Buffer Layer," all of which are hereby incorporated by reference in their entireties.

BRIEF SUMMARY

A dual width SOI FinFET having a strained channel and raised source and drain regions is disclosed, along with a method of fabrication. In fabricating strained FinFET devices, especially those having short channels less than about 20 nm in length, one challenge that arises is forming a very narrow semiconducting fin without inadvertently relieving strain in the fin material. Subjecting the fin to a subtractive process such as reactive ion etching (RIE) removes material by a combination of mechanical and chemical mechanisms wherein the mechanical aspect imparts destructive kinetic energy to the crystal lattice of the fin. The present inventors have observed that such a process tends to relax strain in the crystal lattice, whereas wet etching is a purely chemical process that alters the lattice more gently, thus having the potential to maintain strain. However, wet etching has the constraint that it is an isotropic process lacking in directional control.

A fabrication method is disclosed in which lateral recess of a strained fin in the source and drain regions is accomplished using a wet chemical etching process so as to maintain a high degree of strain in the fin while trimming the fin width in the source and drain regions to less than 5 nm. The resulting FinFET features a wider fin underneath the gate, and a narrower fin in the source and drain regions. An advantage of the narrower fin is that it can be more easily doped during the growth of the epitaxial raised source and drain regions.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale.

FIGS. 2A, 3A, 4A, 5A, 6A are top plan views of the dual width FinFET at successive steps during fabrication using the method shown in FIG. 1, wherein sidewall spacers are omitted for clarity.

FIGS. 2B, 3B, 4B, 5B, 6B are cross-sectional views, along a cut line through the source/drain regions of the dual width FinFET at successive steps during fabrication using the method shown in FIG. 1.

FIGS. 3C, 4C, 5C, 6C are cross-sectional views, along a cut line through a fin and across the gate of the dual width FinFET at successive steps during fabrication using the method shown in FIG. 1.

FIGS. 3D, 4D, 5D, 6D are cross-sectional views, along a cut line through the gate and across a fin of the dual width FinFET at successive steps during fabrication using the method shown in FIG. 1.

DETAILED DESCRIPTION

Figure 1:
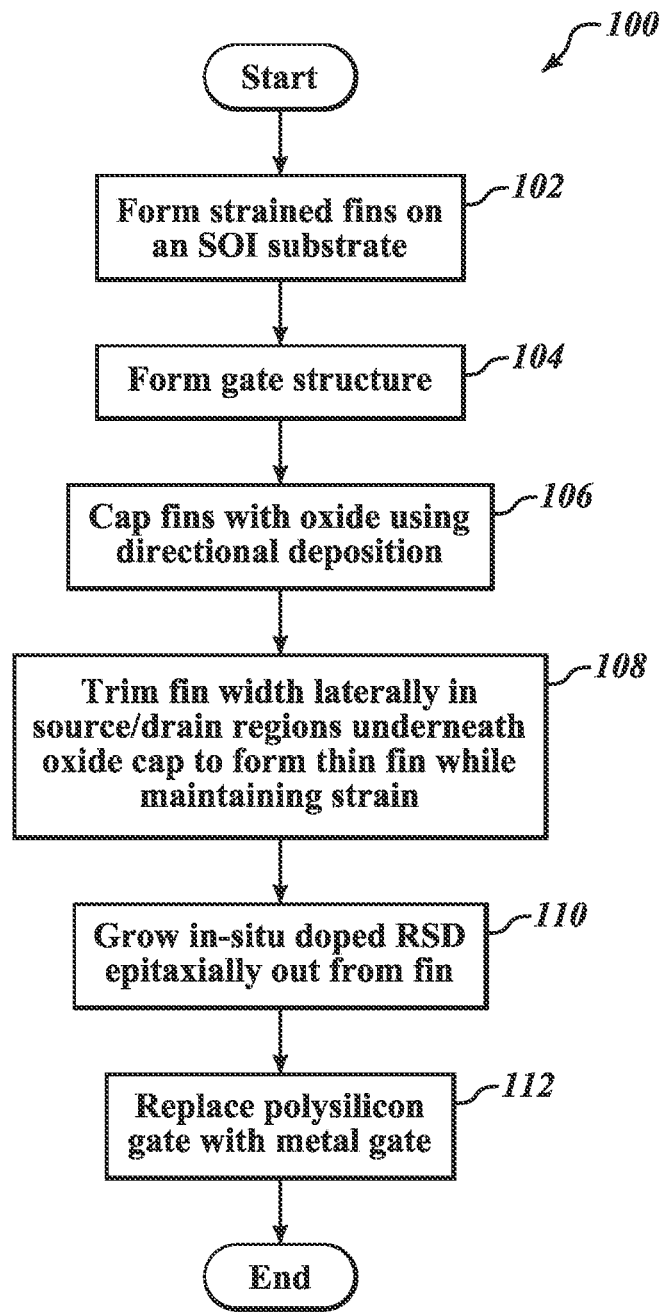
FIG. 1 is a flow diagram showing steps in a method of fabricating a dual width FinFET as illustrated in FIGS. 2A-6D, according to one embodiment as described herein.
Figure 3A:
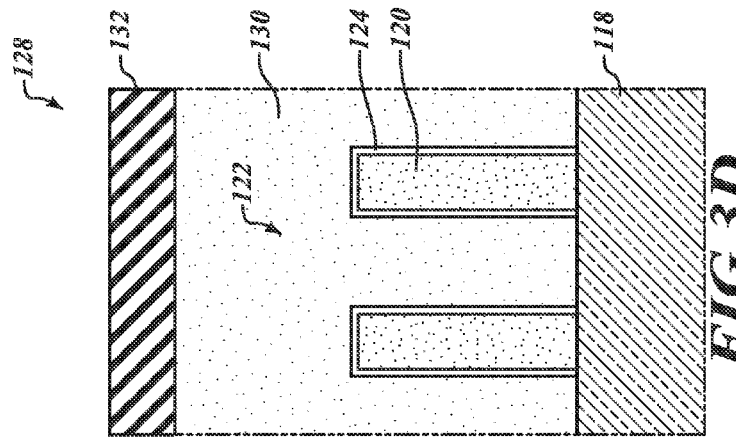
Figure 3B:
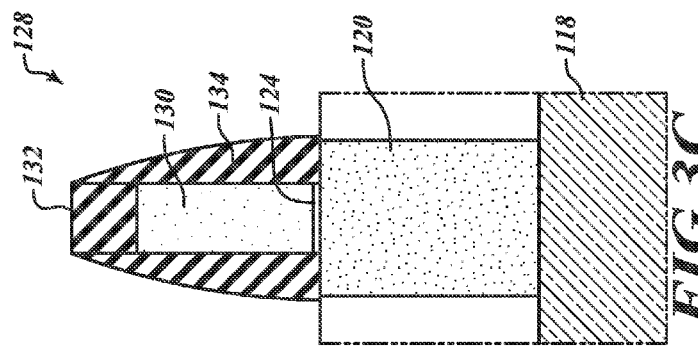
Figure 3C:
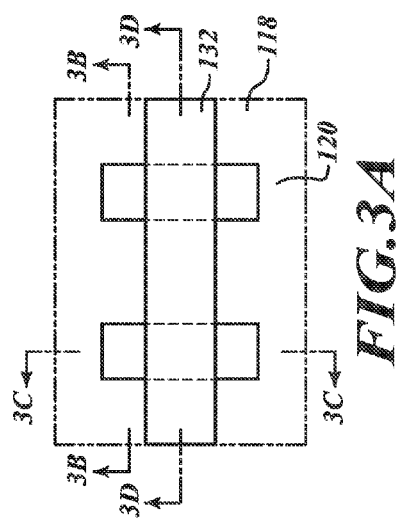
Figure 3D:
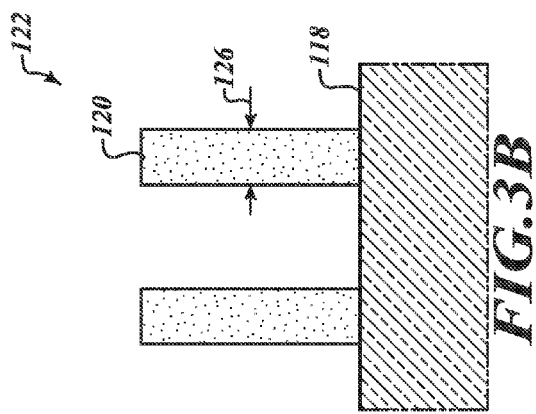

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to integrated circuits is generally intended to include integrated circuit components built on semiconducting substrates, whether or not the components are coupled together into a circuit or able to be interconnected. Throughout the specification, the term "layer" is used in its broadest sense to include a thin film, a cap, or the like and one layer may be composed of multiple sub-layers.

Reference throughout the specification to conventional thin film deposition techniques for depositing silicon nitride, silicon dioxide, metals, or similar materials include such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electro-less plating. Furthermore, reference to conventional techniques of thin film formation may include growing a film in-situ. For example, in some embodiments, controlled growth of an oxide to a desired thickness can be achieved by exposing a silicon surface to oxygen gas or to moisture in a heated chamber.

Reference throughout the specification to conventional photolithography techniques, known in the art of semiconductor fabrication for patterning various thin films, includes a spin-expose-develop process sequence typically followed by an etch process. Alternatively or additionally, photoresist can also be used to pattern a hard mask (e.g., a silicon nitride hard mask), which, in turn, can be used to pattern an underlying film.

Reference throughout the specification to conventional etching techniques known in the art of semiconductor fabrication for selective removal of polysilicon, silicon nitride, silicon dioxide, metals, photoresist, polyimide, or similar materials includes such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable. For example, stripping photoresist may entail immersing a sample in a wet chemical bath or, alternatively, spraying wet chemicals directly onto the sample.

Specific embodiments are described herein with reference to dual width FinFETs that have been produced; however, the present disclosure and the reference to certain materials, dimensions, and the details and ordering of processing steps are exemplary and should not be limited to those shown.

Turning now to the figures, FIG. 1 shows steps in a method of fabricating a dual width FinFET for high performance integrated circuits, according to one embodiment. Steps in the method 100 for constructing the dual width FinFET on a silicon-on-insulator (SOI) substrate are further illustrated by FIGS. 2A-6D, and described below. In each of the Figures, A is a top plan view of the device at the present step during fabrication, showing cut lines for the other views. B is a cross-sectional view along a cut line through the gate; C is a cross-sectional view along a cut line across the gate, aligned with a fin; and D is a cross-sectional view along a cut line across the fins in the source/drain region.

At 102, according to one embodiment, strained fins 122 are formed on an SOI wafer, the strained fins 122 having a substantially uniform fin width 126. The SOI wafer includes a silicon substrate, a buried oxide (BOX) layer 118, and a top silicon layer 120 having a thickness in the range of about 35-50 nm. It is noted that the silicon substrate is omitted from the Figures, for simplicity. Alternatively, a strained SOI (sSOI) wafer can be used, which is supplied with strain already imparted to the top silicon layer 120. SOI wafers and sSOI wafers are standard starting materials that are commonly used in the semiconductor industry. Alternatively, a bulk silicon wafer can be used as the starting material wherein both the BOX layer 118 and the strained top silicon layer 120 can be formed as initial steps of the present fabrication process. If strained silicon germanium (SiGe) fins are desired, e.g., for PFET devices, germanium atoms can be incorporated into the top silicon layer 120 using methods known in the art to form a tensile-strained SiGe film. A strain relaxed buffer (SRB) layer, known in the art, optionally may be included in the substrate to stabilize a top silicon layer 120 having a high germanium concentration. Alternatively, carbon atoms can be incorporated into the top silicon layer 120 to create strained silicon carbide (SiC) fins.

The top silicon layer 120 can be patterned to form the fins 122 shown in FIGS. 2A, 2B using a conventional extreme ultraviolet (EUV) direct lithography process for wider fins, or, for example, a self-aligned sidewall image transfer (SIT) process for narrower fins. In the embodiment described herein, the fin width 126 is narrow, desirably in the range of about 6-12 nm, which can be achieved using the SIT technique. The SIT technique is well known in the art and therefore is not explained herein in detail. The SIT process is capable of defining very high aspect ratio fins 122 using SiN sidewall spacers as a fin hard mask. According to the SIT technique, a mandrel, or temporary structure, is formed first, on top of the top silicon layer 120. Then a silicon nitride film is deposited conformally over the mandrel and planarized to form sidewall spacers on the sides of the mandrel. Then the mandrel is removed, leaving behind a pair of narrow sidewall spacers that serve as a hard mask for defining the fins 122. Once the hard mask is patterned, the fins 122 are etched into the top silicon layer 120, down to the BOX 118. The fins 122 thus formed will serve as channel regions of the FinFET.

After the fins 122 are formed, a thick gate oxide 124 is grown from the silicon surfaces as shown in FIG. 2B. The fins 122 are then patterned to remove the gate oxide 124 from portions of the fins that will be in the source and drain regions of the FinFET, while being retained in the gate region.

At 104, a gate structure 128 is formed that wraps around three sides of each fin 122 as shown in FIGS. 3A-3D. The gate structure 128 thus delineates three portions of each fin 122. The first, central portion underneath the gate structures is the channel regions of the FinFET. A second portion extends out from the gate structure 128 into a source region of the FinFET. A third portion of the fin extends out from the gate structure 128 into a drain region of the FinFET.

Processing steps used to form such a gate structure are well known in the art, and therefore need not be described herein in detail. In one embodiment, the gate structure 128 includes a polysilicon gate 130, a silicon nitride (SiN) cap 132, and sidewall spacers 134 made of SiN or a low-k material such as silicon-boron-carbon nitride (SiBCN). It is noted that the gate structure does not appear in FIG. 3B because the cut line intersects the fin outside the gate region.

At 106, silicon dioxide ($SiO_2$) film 140 is directionally deposited on top of the fins 122 and on top of the SiN cap 132, as shown in FIGS. 4A-4D. Directional deposition can be performed using, for example, a gas cluster ion beam (GCIB) process. The GCIB process is known in the art and has been described in U.S. Patent Publication No. 2014/0239401 for use in angled implantation. A directional deposition process that employs a GCIB can be obtained as a proprietary process provided with thin film deposition equipment supplied by Applied Materials, Inc., for example. The directional deposition process deposits the oxide film 140 preferentially on horizontal surfaces, with minimal deposition on the sidewalls of the fins 122 or the sidewall spacers 134. In one embodiment, the oxide film 140 has a thickness in the range of about 10-15 nm. Following the directional deposition step, a short hydrofluoric (HF) acid dip can be performed to touch up the sidewalls, without removing a significant portion of the oxide film 140 from the horizontal surfaces.

Figure 5A:
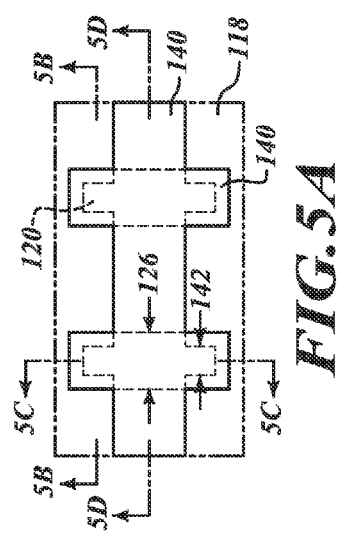
Figure 5B:
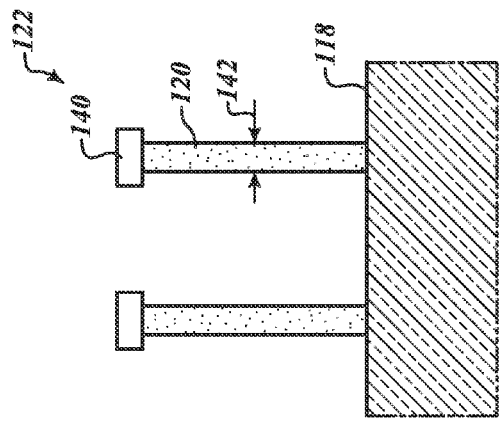
Figure 5C:
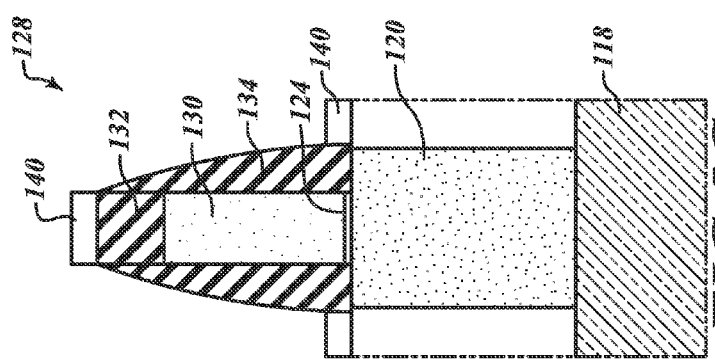
Figure 5D:
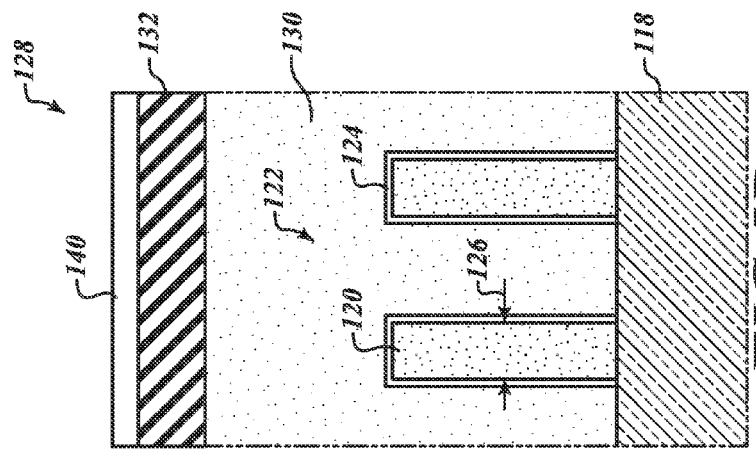

At 108, the fins 122 are trimmed to reduce the fin width 126 of the second and third portions of the fins, outside the gate region, to a narrower fin width 142, as shown in FIGS. 5A-5D. Meanwhile, the channel regions of the fins underneath the gate structure 128 retain their original fin width 126, thus creating dual width fins. The first and second fin widths, 124 and 126, are indicated in FIG. 5A. In one embodiment, the narrower fin width 142 is about 4 nm, whereas the original fin width 126 is targeted to be about 8 nm. The fin width can be trimmed using, for example, an SC1 wet etching process that attacks the silicon, or SiGe, fins laterally while the oxide film 140 protects the tops of the fins 122, as shown in FIG. 5B. The etchant will also trim the ends of the fins 122, farthest from the gate structure 128, causing the overall length of the fin to be slightly shorter. Under the gate structure 128, however, the fins 122 are protected by the oxide 124 as well as the polysilicon gate 130 and the SiN cap 132, which are in contact with the sides and the tops of the fins, as shown in FIG. 5D. The oxide film 140 on top of the cap, shown in FIG. 5C, is not actually needed, but neither is it detrimental.

One advantage of the narrower fin width 142 of the fin portions in the source and drain regions is that narrower fins can be more easily doped. For example, when dopants are introduced into the thinner portions of the fins, the dopants are more uniformly distributed, which contributes to sharper source and drain junctions. Unfortunately, etching the fins 122 tends to relax the strain. However, with the use of dual width fins 122, the channel regions of the fins, i.e., the regions underneath the gate structure 128, remain un-etched, so the strain in the channel regions is not compromised. Hence, the mobility of charge carriers in the channel regions remains enhanced, preserving the performance benefit of the strained channel devices.

At 110, the oxide film 140 is removed using a conventional pre-clean, e.g., a short hydrofluoric acid (HF) dip. A top portion of the BOX may be removed in the pre-clean step, however, the BOX will be substantially unaffected because it is much thicker than the oxide film 140. After the oxide film 140 is removed, raised source and drain (RSD) regions 144 are grown epitaxially from the side surfaces and top surfaces of the fins 122 as shown in FIGS. 6A-6D, forming charge reservoirs having elongated diamond-shaped profiles. The RSD regions 144 can be doped in-situ during the epitaxy process with arsenic (As) or phosphorous (P) for NFET devices, or boron (B) for PFET devices. Exposure of the fins 122 to the dopant species also incorporates dopants into the fins, which distribute uniformly through the narrow fin width 142. During operation of the FinFET, the RSD regions 144 supply charge carriers to support current flow within the channel portion of the fins 122. The RSD regions 144 are only grown outside the gate structure 128 where the fins 122 are exposed. Hence, RSD regions 144 are not shown in cross-sectional view of FIG. 6D.

At 112, the polysilicon gate 130 can be removed and replaced with a metal gate using a replacement metal gate (RMG) process that is well known in the art. In the RMG process, the polysilicon gate 130 is exposed to an etchant that consumes the polysilicon, selective to SiN, thus leaving the sidewall spacers substantially intact. The sidewall spacer structure is then filled with metal. The metal gate may include multiple layers such as a work function metal e.g., titanium nitride (TiN) or titanium carbide (TiC), and a gate electrode typically made of tungsten (W).

Finally, contacts can be made to the completed dual width FinFET device using, for example, a conventional damascene process that entails deposition of an inter-layer dielectric (ILD), etching contact holes in the ILD, and filling the contact holes with metal.

It will be appreciated that, although specific embodiments of the present disclosure are described herein for purposes of illustration, various modifications may be made without departing from the spirit and scope of the present disclosure. Accordingly, the present disclosure is not limited except as by the appended claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

The invention claimed is:

1. A FinFET, comprising:
a silicon substrate having an oxide layer buried therein;
a raised silicon source region overlying the silicon substrate;
a raised silicon drain region overlying the silicon substrate;
a strained silicon fin having, as a first portion, a channel region that extends between the raised source and drain regions, the channel region having a first fin width, a second fin portion in the source region, the second fin portion having a second fin width that is smaller than the first fin width, and a third fin portion in the drain region, the third fin portion having a third fin width that is substantially equal to the second fin width; and
a metal gate structure that wraps around at least three sides of the strained silicon fin to control current flow in the channel region.

2. The FinFET of claim 1 wherein the first fin width has a range of 6-12 nm and the second fin width is less than 5 nm.

3. The FinFET of claim 1 wherein in the raised source and drain regions, the strained silicon fin has an aspect ratio in a range of 5-10.

4. The FinFET of claim 1 wherein the strained silicon fin includes one or more of silicon (Si), silicon germanium (SiGe), or silicon carbide (SiC).

5. The FinFET of claim 1 wherein the strained silicon fin includes as dopants one or more of arsenic (As), boron (B), and phosphorous (P).

6. The FinFET of claim 1 wherein the metal gate structure includes sidewall spacers made of one or more of silicon nitride (SiN) or SiBCN.

7. A FinFET, comprising:
a raised source region;
a raised drain region;
a fin extending from the raised source region to the raised drain region, the fin having a non-uniform fin width that varies along a length of the fin, a channel region of the fin being approximately twice as thick as portions of the fin outside the channel region; and
a gate that wraps around three sides of the channel region of the fin, the gate configured to control current flow within the channel region, between the raised source region and the raised drain region.

8. The FinFET of claim 7 wherein the channel region of the fin is a strained channel region.

9. The FinFET of claim 7 wherein portions of the fin outside the channel region exhibit a substantially uniform distribution of dopants.

10. The FinFET of claim 7 wherein the raised source and drain regions have diamond-shaped profiles.

11. A device, comprising:
a silicon substrate;
a buried oxide layer in the silicon substrate;
a strained silicon fin above the buried oxide layer, the strained silicon fin including a wide portion having a first fin width and a narrow portion having a second fin width;
a top oxide layer covering the strained silicon fin;
a gate structure adjacent to the strained silicon fin, the gate structure including a metal gate electrode and a gate oxide adjacent to the gate electrode; and
raised source and drain regions adjacent to the strained silicon fin, the wide portion corresponding to a channel region, the narrow portion corresponding to the source and drain regions.

12. The device of claim 11 wherein the silicon substrate is a strained silicon-on-insulator substrate.

13. The device of claim 11 wherein the wide portion and the narrow portion have substantially a same degree of strain.

14. The device of claim 11 wherein the wide portion is at least 20% wider than the narrow portion.

15. The device of claim 11 wherein the raised source and drain regions have elongated diamond-shaped profiles.

16. A device, comprising:
a silicon substrate;
a buried oxide layer in the silicon substrate;
a strained silicon fin above the buried oxide layer, the strained silicon fin including a wide portion having a first fin width and a narrow portion having a second fin width, the wide portion and the narrow portion having substantially a same degree of strain;
a top oxide layer covering the strained silicon fin;
a gate structure adjacent to the strained silicon fin, the gate structure including a metal gate electrode and a gate oxide adjacent to the gate electrode; and
raised source and drain regions adjacent to the strained silicon fin.

17. The device of claim 16 wherein the first fin width is different from the second fin width.

18. The device of claim 16 wherein the raised source and drain regions are formed on at least three sides of the narrow portion of the strained silicon fin.

19. A FinFET, comprising:
a raised source region;
a raised drain region;
a fin extending from the raised source region to the raised drain region, the fin having a non-uniform fin width that varies along a length of the fin, portions of the fin outside a channel region of the fin having a substantially uniform distribution of dopants; and
a gate that wraps around three sides of the channel region of the fin, the gate configured to control current flow within the channel region, between the raised source region and the raised drain region.

20. The FinFET of claim 19 wherein the channel region of the fin is approximately twice as thick as portions of the fin outside the channel region.

21. The FinFET of claim 19 wherein the raised source and drain regions have diamond-shaped profiles.

* * * * *